(12) United States Patent
Suh et al.

(10) Patent No.: US 9,278,863 B2
(45) Date of Patent: Mar. 8, 2016

(54) METHOD FOR MANUFACTURING GRAPHENE QUANTUM DOT USING THERMAL PLASMA

(71) Applicant: SNU R&DB FOUNDATION, Seoul (KR)

(72) Inventors: Jung Sang Suh, Seoul (KR); Ju Han Kim, Daegu (KR)

(73) Assignee: SNU R&DB FOUNDATION, Seoul (KR)

(*) Notice: Subject to any disclaimer, the term of this patent is extended or adjusted under 35 U.S.C. 154(b) by 0 days.

(21) Appl. No.: 14/557,745

(22) Filed: Dec. 2, 2014

(65) Prior Publication Data

US 2015/0087138 A1     Mar. 26, 2015

Related U.S. Application Data

(63) Continuation of application No. PCT/KR2013/005109, filed on Jun. 11, 2013.

(30) Foreign Application Priority Data

Jun. 11, 2012  (KR) .................. 10-2012-0062115
Jun. 10, 2013  (KR) .................. 10-2013-0066141

(51) Int. Cl.
| | | |
|---|---|---|
| *B82Y 40/00* | (2011.01) | |
| *B82Y 15/00* | (2011.01) | |
| *C01B 31/04* | (2006.01) | |
| *H01L 21/02* | (2006.01) | |

(52) U.S. Cl.
CPC .......... *C01B 31/0453* (2013.01); *C01B 2204/20* (2013.01); *H01L 21/02527* (2013.01); *H01L 21/02601* (2013.01); *H01L 21/02628* (2013.01)

(58) Field of Classification Search
CPC ........ B82Y 30/00; B82Y 40/00; B82Y 15/00; H01L 29/1606; H01L 31/035218; H01L 29/41; H01L 31/035227; C01B 31/0438
See application file for complete search history.

(56) References Cited

U.S. PATENT DOCUMENTS

| | | | | |
|---|---|---|---|---|
| 8,617,669 B1 * | 12/2013 | Quick et al. | .................. | 427/586 |
| 8,647,436 B2 * | 2/2014 | Barker et al. | .................. | 117/109 |
| 8,721,843 B2 * | 5/2014 | Fullerton et al. | ......... | 204/157.47 |

FOREIGN PATENT DOCUMENTS

| | | | |
|---|---|---|---|
| KR | 10-2006-0100019 A | | 9/2006 |
| KR | 10-2010-0110216 A | | 10/2010 |
| KR | 1020100110216 | * | 10/2010 |
| KR | 10-2011-0064164 A | | 6/2011 |
| KR | 10-2012-0029332 A | | 3/2012 |
| KR | 10-2013-0050167 A | | 5/2013 |
| WO | 2011/085185 A1 | | 7/2011 |

OTHER PUBLICATIONS

Translation of KR-1020100110216, published Oct. 2010.*
International Search Report from International Application No. PCT/KR2013/005109 mailed Sep. 6, 2013.

* cited by examiner

*Primary Examiner* — Thomas L Dickey
*Assistant Examiner* — Gustavo Ramallo
(74) *Attorney, Agent, or Firm* — Brundidge & Stanger, P.C.

(57) ABSTRACT

The present application provides a method for producing a graphene quantum dot using thermal plasma, comprising injecting a carbon source into a thermal plasma jet to pyrolyze the carbon source so as to form a carbon atomic beam and allowing the carbon atomic beam to flow in a tube connected to an anode to produce a graphene quantum dot.

12 Claims, 14 Drawing Sheets

METHOD FOR MANUFACTURING GRAPHENE QUANTUM DOT USING THERMAL PLASMA

TECHNICAL FIELD

The embodiments described herein pertain generally to a method for producing a graphene quantum dot using thermal plasma.

BACKGROUND ART

Graphene is a material having a two-dimensional planar structure in a honeycomb shape, in which carbon atoms are connected to one another to form a hexagonal structure, and exhibits chemically high stability. In addition, since graphene has at least one hundred (100) times greater electrical conductivity than silicon and is flexible and transparent, it is drawing much attention as a next-generation semiconductor material.

With respect to a method for producing a quantum dot of graphene, there are known a top down method that sizes down large-size graphene, a bottom up method that self-assembles and then pyrolyzes a small carbon ring material like hexa-peri-hexabenzocoronene (HBC), and others. In addition, Korean Patent Application Publication No. 2013-0050167 discloses a method for producing a graphene quantum dot and a graphene quantum dot produced by the method. However, these methods have a limit in large-scale production of graphene quantum dots. Further, since a graphene quantum dot is known to have applicability in various fields, it is necessary to develop a technology capable of producing high crystalline graphene quantum dots in a large scale for research of physical properties and application of the graphene quantum dots.

DISCLOSURE OF THE INVENTION

Problems to be Solved by the Invention

Example embodiments relate to a method for producing a graphene quantum dot using thermal plasma, which produces the graphene quantum dot by injecting a carbon source into a thermal plasma jet to pyrolyze the carbon source so as to form a carbon atomic beam to flow at a rapid velocity, and allowing the carbon atomic beam to flow in a tube connected to an anode such that carbon atoms collide with one another while flowing in the tube.

However, the problems sought to be solved by the present disclosure are not limited to the above description and other problems can be clearly understood by those skilled in the art from the following description.

Means for Solving the Problems

In accordance with one aspect of an example embodiment, a method for producing a graphene quantum dot using thermal plasma, comprising injecting a carbon source into a thermal plasma jet to pyrolyze the carbon source so as to form a carbon atomic beam; and allowing the carbon atomic beam to flow in a tube connected to an anode to produce the graphene quantum dot.

Effect of the Invention

In accordance with example embodiments, since a degree of the collision of the carbon atoms occurring within the tube can be controlled by controlling a length of the tube, through which the carbon atomic beam flows, or by controlling an amount of the carbon source, it is possible to control an average size of a quantum dot to be produced, and it is possible to produce a graphene quantum dot in a size of from a few nanometers to hundreds of nanometers. Furthermore, since the carbon source material can be continuously supplied, it is possible to continuously produce a graphene quantum dot in a large scale. In addition, since the thermal plasma jet may have a high temperature ranging from thousands of degrees (° C.) to tens of thousands of degrees (° C.), it is possible to produce a high quality graphene quantum dot having high crystallinity by using the thermal plasma jet.

DETAILED DESCRIPTION

Figure 1:
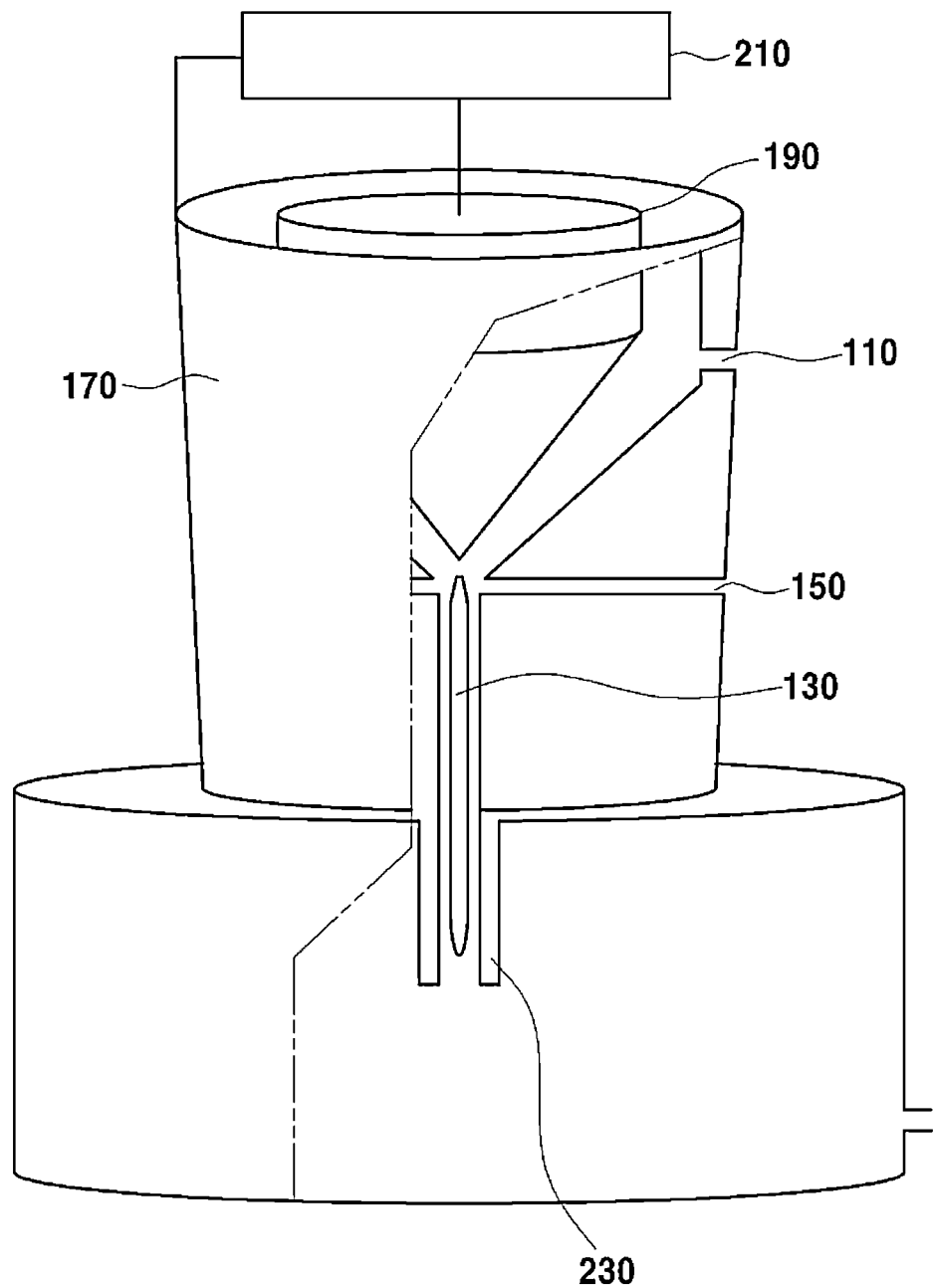
FIG. 1 is a schematic diagram of an apparatus used in a method for producing a graphene quantum dot using thermal plasma in accordance with an example of the present application disclosure.

Hereinafter, example embodiments will be described in detail with reference to the accompanying drawings so that inventive concept may be readily implemented by those skilled in the art. However, it is to be noted that the present disclosure is not limited to the example embodiments but can be realized in various other ways. In the drawings, certain parts not directly relevant to the description are omitted to enhance the clarity of the drawings, and like reference numerals denote like parts throughout the whole document.

Throughout the whole document, the term "comprises or includes" and/or "comprising or including" used in the document means that one or more other components, steps, operations, and/or the existence or addition of elements are not excluded in addition to the described components, steps, operations and/or elements.

In this document, the terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party. Throughout the whole document, the term "step of" does not mean "step for."

Throughout the whole document, the term "on" that is used to designate a position of one element with respect to another element includes both a case that the one element is adjacent to the another element and a case that any other element exists between these two elements.

Throughout the whole document, the term "combination(s) of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Throughout the whole document, the description "A and/or B" means "A or B, or A and B."

Hereinafter, example embodiments and Examples of the present disclosure are described in detail with reference to the accompanying drawings, but the present disclosure is not limited to the example embodiments and the Examples.

In accordance with a first aspect of example embodiments, there are provided a method for producing a graphene quantum dot using thermal plasma, which includes injecting a carbon source into a thermal plasma jet to pyrolyze the carbon source so as to form a carbon atomic beam, and allowing the carbon atomic beam to flow in a tube connected to an anode to produce the graphene quantum dot.

FIG. 1 is a schematic diagram of an apparatus used in a method for producing a graphene quantum dot using thermal plasma in accordance with an example embodiment.

According to FIG. 1, in the apparatus used in the method for producing a graphene quantum dot using thermal plasma, plasma gas is injected through a plasma gas inlet 110 so as to form a high temperature plasma jet 130, and a carbon source inlet 150 may be formed near the plasma jet. In addition, the apparatus may include an anode 170, a cathode 190, and a power supply 210 connected to the anode and the cathode, and a tube 230 may be connected to the anode.

For example, the method for producing a graphene quantum dot using thermal plasma may include pyrolyzing and atomizing a relatively excess amount of a hydrocarbon-based material such as ethylene under a high temperature provided by a thermal plasma jet, and then, introducing the carbon atoms into the thermal plasma jet to generate a carbon atomic beam, and allowing the carbon atomic beam to flow in the tube which is attached to an anode and to allow the carbon atoms to collide with one another while flowing in the tube so as to produce a graphene quantum dot of a small size in a large scale, but may not be limited thereto.

For example, forming the carbon atomic beam may include introducing the carbon atoms pyrolyzed and atomized by the high temperature thermal plasma jet into the thermal plasma jet so as to form the rapidly flowing carbon atomic beam, but may not be limited thereto.

The "method for producing graphene by using thermal plasma" (Korean Patent Application Publication No. 10-2009-0028681), which was previously developed by the inventors of the present application, relates to continuously injecting a small amount of a carbon source into thermal plasma to allow a carbon atomic beam having relatively low carbon atom density to flow in the carbon tube, and then, allowing the carbon atomic beam to collide with a graphite plate, wherein graphene is produced on the graphite surface by epitaxial growth, and whereby the graphene in a size of from tens of nanometers to a few micrometers was produced.

On the other hand, the method for producing a graphene quantum dot using thermal plasma in accordance with an example embodiment may include continuously injecting a relatively excess amount of a carbon source into a thermal plasma jet such that collision of carbon atoms occurs within the tube while the carbon atomic beam having high density flows in the tube, so as to produce a graphene quantum dot of a small size. That is, since the previous method for producing graphene produces graphene on a surface of graphite, it is substantially different from the method for producing a graphene quantum dot in accordance with an example embodiment.

In accordance with an example embodiment, the method may include allowing carbon atoms to collide to another in the tube to produce the graphene quantum dot while the carbon atomic beam flows in the tube, but may not be limited thereto.

For example, an internal diameter of the tube may be from about 1 mm to about 50 mm, but not be limited thereto. For example, the diameter of the tube may be from about 1 mm to about 50 mm, from about 5 mm to about 50 mm, from about 10 mm to about 50 mm, from about 20 mm to about 50 mm, from about 30 mm to about 50 mm, from about 40 mm to about 50 mm, from about 1 mm to about 40 mm, from about 1 mm to about 30 mm, from about 1 mm to about 20 mm, from about 1 mm to about 10 mm, from about 1 mm to about 5 mm, or from about 4 mm to about 6 mm, but not be limited thereto.

For example, a length of the tube may be from about 5 cm to about 100 cm, and may be, for example, from about 5 cm to about 100 cm, from about 10 cm to about 100 cm, from about 30 cm to about 100 cm, from about 50 cm to about 100 cm, from about 70 cm to about 100 cm, from about 5 cm to about 70 cm, from about 5 cm to about 50 cm, from about 5 cm to about 20 cm, or from about 5 cm to about 10 cm, but not be limited thereto.

For example, the time during which the collision of the carbon atoms occurs may be controlled by controlling the length of the tube, so that an average size of the graphene quantum dot to be produced may be controlled, but the present disclosure may not be limited thereto.

For example, an injection rate of the carbon source may be from about 500 mL/min to about 10,000 mL/min, and for example, from about 500 mL/min to about 10,000 mL/min, from about 1,000 mL/min to about 10,000 mL/min, from about 3,000 mL/min to about 10,000 mL/min, about 5,000 mL/min to about 10,000 mL/min, from about 7,000 mL/min to about 10,000 mL/min, from about 500 mL/min to about 7,000 mL/min, from about 500 mL/min to about 5,000 mL/min, from about 500 mL/min to about 3,000 mL/min, or from about 500 mL/mint to about 1,000 mL/min, but not be limited thereto.

For example, a size of the graphene quantum dot produced by the method for producing a graphene quantum dot using thermal plasma in accordance with an example embodiment may be from about 1 nm to about 100 nm, and for example, from 1 nm to about 100 nm, from about 5 nm to about 100 nm, from about 10 nm to about 100 nm, from about 30 nm to about 100 nm, from about 50 nm to about 100 nm, from about 70 nm to about 100 nm, from about 1 nm to about 70 nm, from about 1 nm to about 50 nm, from about 1 nm to about 30 nm, from about 1 nm to about 10 nm, or from about 1 nm to about 5 nm, but not be limited thereto.

For example, the carbon atomic beam may have a relatively high carbon atom density, but not be limited thereto.

For example, the carbon source is pyrolyzed and completely atomized at a high temperature, and the carbon atomic beam including the carbon atoms flow in the tube such that the carbon atoms collide with one another to produce a graphene quantum dot having high crystallinity, but the present disclosure may not be limited thereto.

For example, probability of the collision of the carbon atoms may be controlled by controlling an amount of the carbon source to be injected per unit time, by which the average size of the graphene quantum dot to be produced may be controlled, but the present disclosure may not be limited thereto.

In accordance with example embodiments, since a relatively large amount of a carbon source can be continuously supplied, it is possible to continuously produce the graphene quantum dot in a large scale.

In accordance with an example embodiment, example embodiments may further include dispersing the pyrolyzed carbon source and the produced graphene quantum dot in a solvent, and separating and obtaining the graphene quantum dot, but the present disclosure may not be limited thereto.

For example, the carbons pyrolyzed by the thermal plasma jet may include carbon soots, and the carbon soots may include graphene, carbon materials having different sizes, onion-shaped carbon materials and others, but not be limited thereto. Accordingly, it is possible to disperse the carbon soots in the solvent, and then, separate and obtain the graphene quantum dot dispersed in the solvent from materials other than the graphene, which have not been easily dispersed in the solvent, but the present disclosure may not be limited thereto.

For example, in order to obtain the graphene quantum dot from the carbon soots dispersed in the solvent, a method that disperses the carbon soots in a solvent like ethanol, followed by natural precipitation, promotes the precipitation by using a centrifuge, and/or removes precipitates by using a filter may be used, but the present disclosure may not be limited thereto.

For example, the solvent may include water and/or an organic solvent, but not be limited thereto.

In accordance with an example embodiment, the solvent may include an organic solvent, but not be limited thereto. For example, the organic solvent may include a member selected from the group consisting of ethanol, benzene, an ether, acetone, toluene, dimethyl sulfoxide (DMSO), pyridine, and combinations thereof, but not be limited thereto.

In accordance with an example embodiment, the thermal plasma jet may be generated by supplying a plasma gas to a plasma torch, but not be limited thereto. For example, the plasma torch may include a transferred or non-transferred type of a plasma torch, but not be limited thereto. For example, the plasma torch may include an anode and a cathode, but not be limited thereto. For example, a diameter of the anode may be from about 1 mm to about 50 mm, but not be limited thereto. For example, the diameter of the anode may be from about 1 mm to about 50 mm, from about 5 mm to about 50 mm, from about 10 mm to about 50 mm, from about 20 mm to about 50 mm, from about 30 mm to about 50 mm, from about 40 mm to about 50 mm, from about 1 mm to about 40 mm, from about 1 mm to about 30 mm, from about 1 mm to about 20 mm, from about 1 mm to about 10 mm, from about 1 mm to about 5 mm, or from about 4 mm to about 6 mm, but not be limited thereto.

In accordance with an example embodiment, the plasma torch may include a non-transferred type of a plasma torch, but not be limited thereto.

For example, in order to inject the carbon source into the thermal plasma jet, a carbon source inlet may be formed in the vicinity of the plasma jet, but the present disclosure may not be limited thereto. For example, the carbon source inlet may be located that is from about 0 mm to about 20 mm away from the cathode, and for example, from about 0 mm to about 20 mm, from about 5 mm to about 20 mm, from about 10 mm to about 20 mm, from about 15 mm to about 20 mm, from about 0 mm to about 15 mm, from about 0 mm to about 10 mm, or from about 0 mm to about 5 mm away from the cathode, but the present disclosure may not be limited thereto.

In accordance with an example embodiment, the plasma gas may include inert gas, and for example, a member selected from the group consisting of argon (Ar), nitrogen ($N_2$), hydrogen ($H_2$), helium (He), neon (Ne), xenon (Xe), radon (Rn), krypton (Kr) and combinations thereof, but may not be limited thereto.

In accordance with an example embodiment, a temperature of the thermal plasma jet may include a temperature of from about 1,000° C. to 20,000° C., but not be limited thereto. For example, the temperature of the thermal plasma jet may include a temperature of from about 1,000° C. to about 20,000° C., about 1,000° C. to about 15,000° C., about 1,000° C. to about 10,000° C., about 1,000° C. to about 5,000° C., about 1,000° C. to about 3,000° C., about 3,000° C. to about 20,000° C., about 5,000° C. to about 20,000° C., about 7,000° C. to about 20,000° C., about 10,000° C. to about 20,000° C., about 15,000° C. to about 20,000° C., or about 5,000° C. to about 10,000° C., but not be limited thereto.

In accordance with an example embodiment, the carbon source may include a gaseous or liquid phase carbon source, but not be limited thereto.

In accordance with an example embodiment, hydrocarbons having a relatively small molecular weight may be used as the carbon source without limitation, and include, for example, a member selected from the group consisting of carbon monoxide, carbon dioxide, methane, ethane, ethylene, ethanol, methanol, propanol, butanol, pentanol, acetylene, propane, butane, butadiene, pentane, pentene, cyclopentadiene, hexane, cyclohexane, benzene, toluene, and combinations thereof, but not be limited thereto. For example, alcohols may be used as the carbon source without limitation, but not be limited thereto.

For example, any materials that can bear the high temperature of the plasma jet may be used as a material for the tube without limitation.

In accordance with an example embodiment, the tube may include a ceramic, a metal, or a carbon, but not be limited thereto.

In accordance with an example embodiment, a size of the graphene quantum dot to be produced may be controlled by controlling the length of the tube, but the present disclosure may not be limited thereto.

In accordance with an example embodiment, a size of the graphene quantum dot to be produced may be controlled by controlling an amount of the carbon source to be injected, but the present disclosure may not be limited thereto.

Hereinafter, example embodiments are described in more detail by using Examples, but the present disclosure may not be limited to the Examples.

Example

Production of a Graphene Quantum Dot Using Thermal Plasma

A plasma jet having a temperature of about 10,000° C. was formed by using a non-transferred type of a thermal plasma torch, and argon (99.999%, an injection rate of 16,000 mL/min) as a plasma gas, and applying voltage of maximum about 3 kV. The temperature of the plasma jet was indirectly measured through flame color. Accordingly, a plasma jet with a rate close to the sound velocity was formed and flowed in a copper nozzle having an internal diameter of about 6 mm. Thereafter, $C_2H_4$ gas was injected into the plasma jet at a rate of from 1,000 mL/min to 2,500 mL/min, and a produced carbon atomic beam was allowed to flow in a carbon tube attached to an anode.

After the produced carbon soots were stirred and dispersed in an ethanol solvent by using a stirring rod, a precipitated material was removed, and thereafter, the ethanol solvent was vaporized, so that a graphene quantum dot was obtained. By this process, a graphene quantum dot corresponding to about 10% of the mass of the carbon soots, i.e., about 10 wt % was obtained.

Figure 2A:
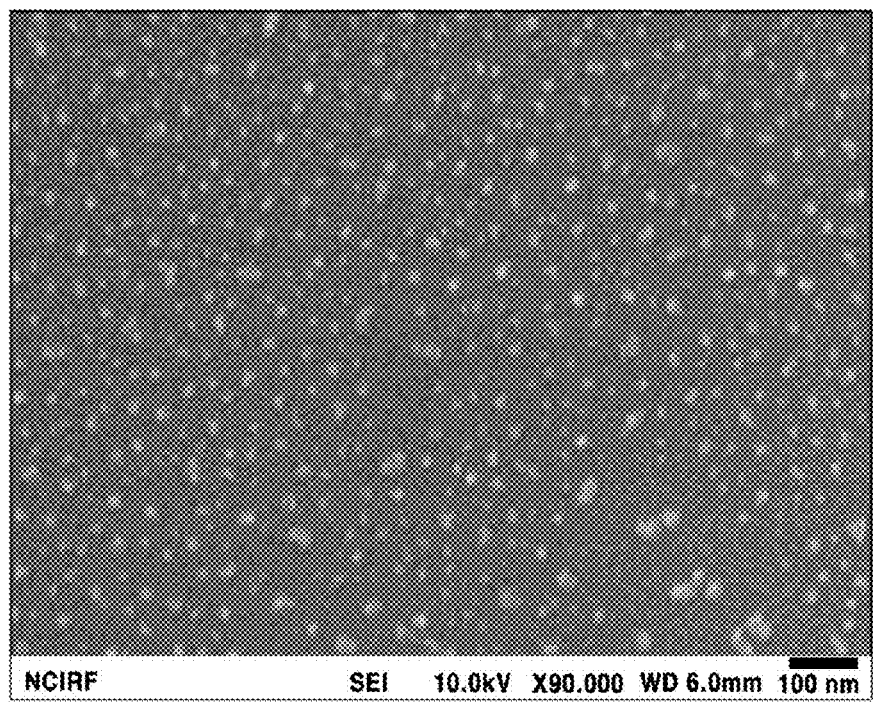
FIG. 2A and FIG. 2B are scanning electron microscope (SEM) images of a graphene quantum dot produced in accordance with an example of the present application disclosure.
Figure 2B:
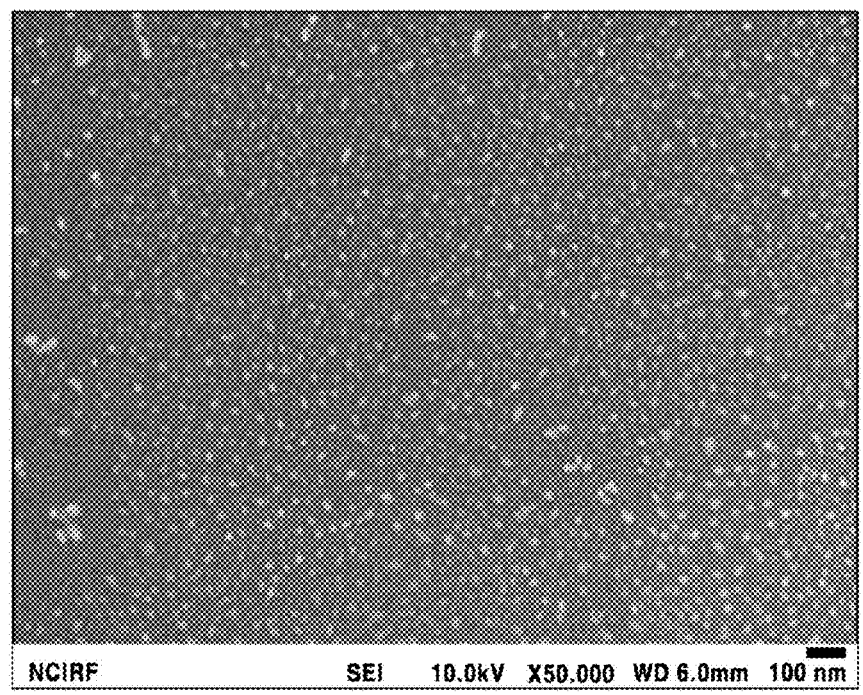

FIG. 2A and FIG. 2B show results of observation of the produced graphene quantum dot using a scanning electron microscope (SEM). FIG. 2A is a 90,000 times enlarged image of graphene quantum dot, and FIG. 2B is a 50,000 times enlarged image of graphene quantum dot. According to FIG. 2A and FIG. 2B, it was confirmed that most of the graphene quantum dots obtained by the present Example are not aggregated together and preferably exist in the independent state. It was presumed that the aggregation of several graphene quantum dots on the image occurred during the sampling process.

Figure 3A:
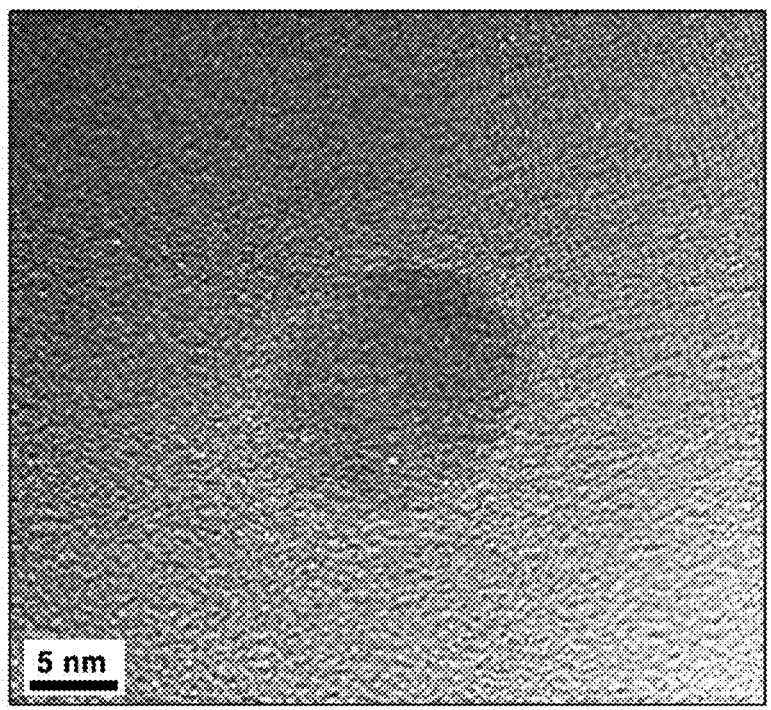
FIG. 3A and FIG. 3B are transmission electron microscope images of a graphene quantum dot produced by controlling an injection rate of a carbon source in accordance with an example of the present application disclosure.

Control of a Size of the Graphene Quantum Dot According to Control of a Injection Rate of the Carbon Source In the present Example, after the graphene quantum dot was produced by varying an injection rate of ethylene used as the carbon source in a range of from 1,000 mL/min to 2,500 mL/min, a size of the produced graphene quantum dot was measured. FIG. 3A shows results of observation of graphene obtained when an injection rate of ethylene is 1,000 mL/min and FIG. 3B shows results of observation of graphene obtained when the injection rate of ethylene is 2,500 mL/min, using a transmission electron microscope (TEM).

Figure 3B:
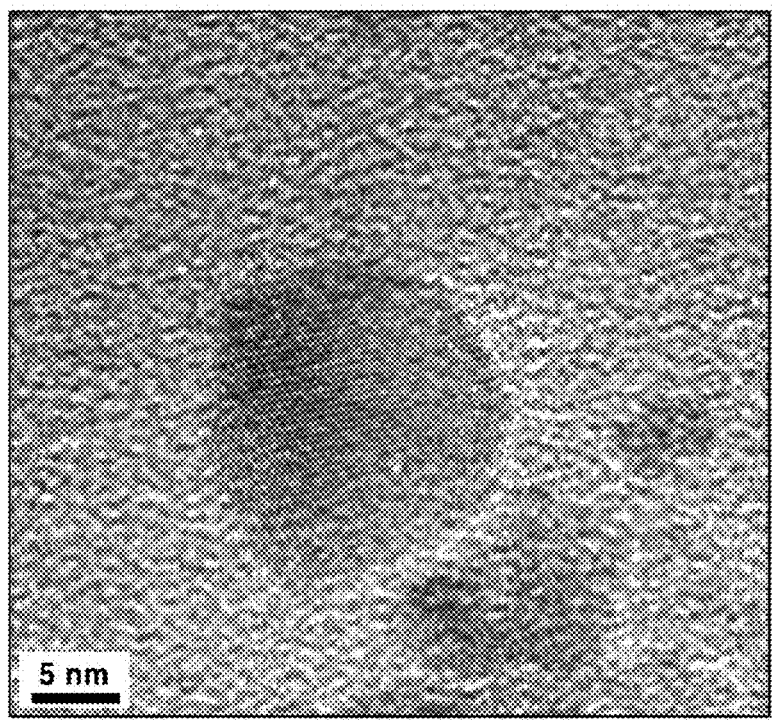

According to FIG. 3A and FIG. 3B, when the injection rate of ethylene was 1,000 mL/min, a graphene quantum dot in a size of about 10 nm was produced, and when the injection rate of ethylene was 2,500 mL/min, a graphene quantum dot in a size of about 19 nm was produced. Thus, it was confirmed that the size of the graphene quantum dot to be produced can be controlled by controlling the injection rate of the carbon source.

Control of a Size of the Graphene Quantum Dot According to Control of a Length of the Tube (1)

Figure 4A:
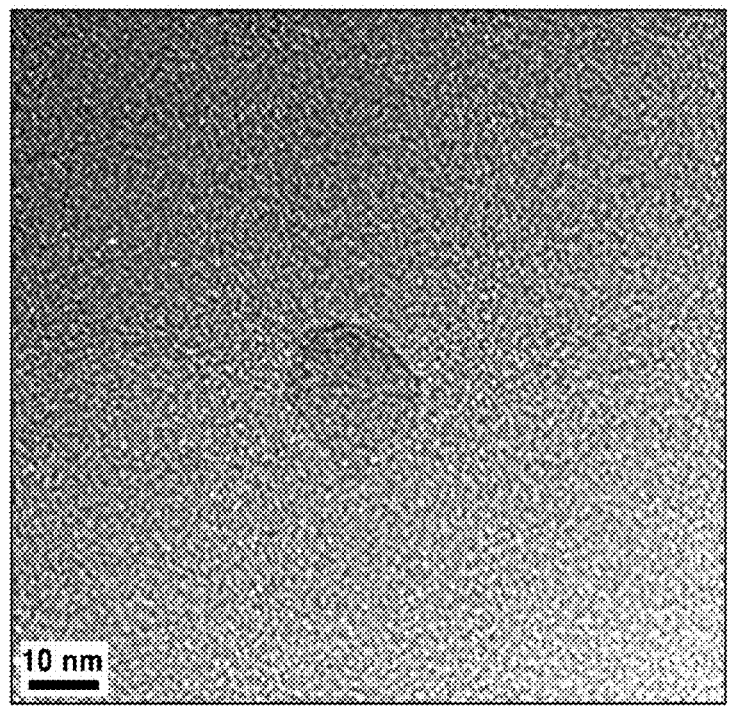
FIG. 4A and FIG. 4b are transmission electron microscope images of a graphene quantum dot produced by controlling a length of a tube in accordance with an example of the present application disclosure.

In the present Example, the graphene quantum dot was produced by using carbon tubes having length of 20 cm and 5 cm (internal diameter of 2.0 cm), respectively, and injecting ethylene at a rate of 2,500 mL/min. FIG. 4A is a transmission electron microscope image of the graphene quantum dot obtained when the carbon tube having 20 cm length was used, and FIG. 4b is a transmission electron microscope image of the graphene quantum dot obtained when the carbon tube having 5 cm length was used.

Figure 4B:
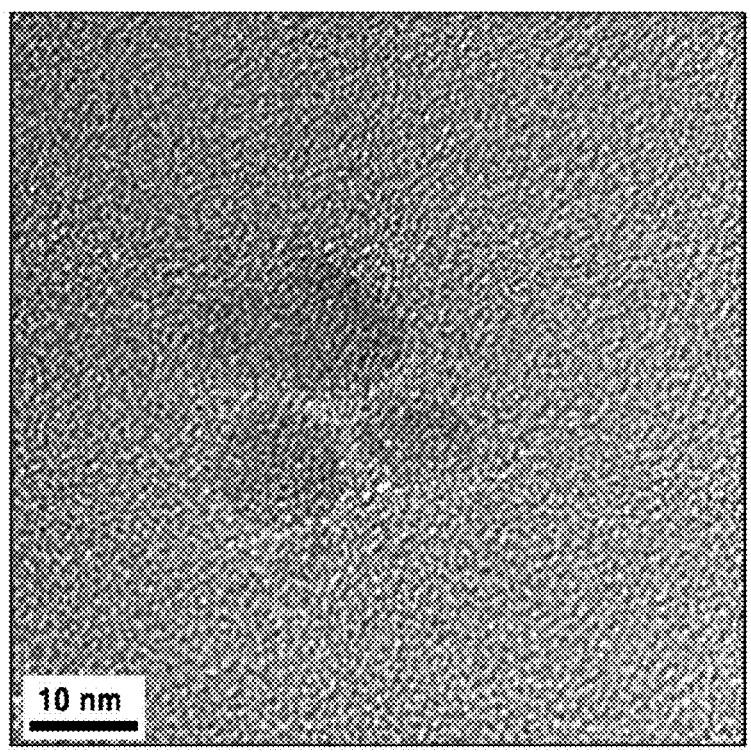

According to FIG. 4A and FIG. 4b, when the carbon tube having 20 cm length was used, a graphene quantum dot in a size of about 20 nm was produced, and when the carbon tube having 5 cm length was used, a graphene quantum dot in a size of about 10 nm was produced. Thus, it was confirmed that the size of the graphene quantum dot to be produced can be controlled by controlling the length of the tube.

Figure 5:
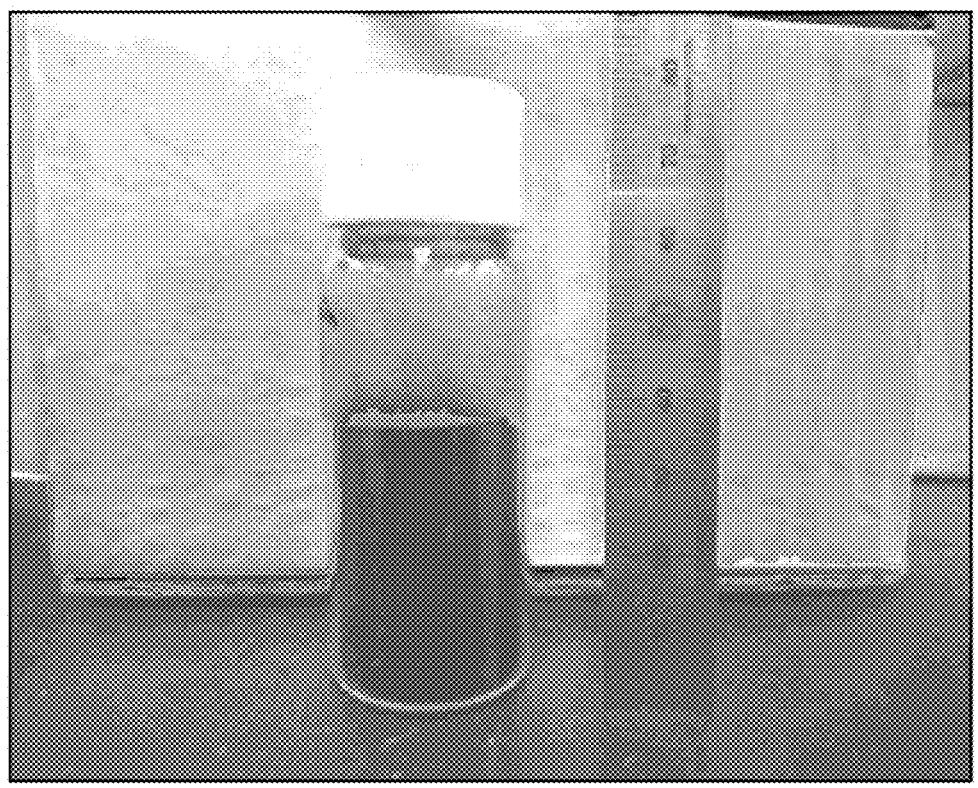
FIG. 5 is a photograph of carbon soots including a graphene quantum dot produced in accordance with an example of the present application disclosure.

FIG. 5 is a photograph of carbon soots obtained by producing the graphene quantum dot using the tube having the 20 cm length for about two (2) minutes. It was confirmed that upon calculating an amount of carbon soots that can be produced per hour based on the production amount and time of the above obtained carbon soots, about 30 g carbon soots can be produced per hour. Since an about 10 wt % graphene quantum dot can be obtained from the carbon soots, it was expected that an about 3 g graphene quantum dot can be produced per hour.

Next, photoluminescence of the graphene quantum dot was measured by using a photoluminescence apparatus including a xenon-arc lamp, a monochromater, and a detector.

Figure 6:
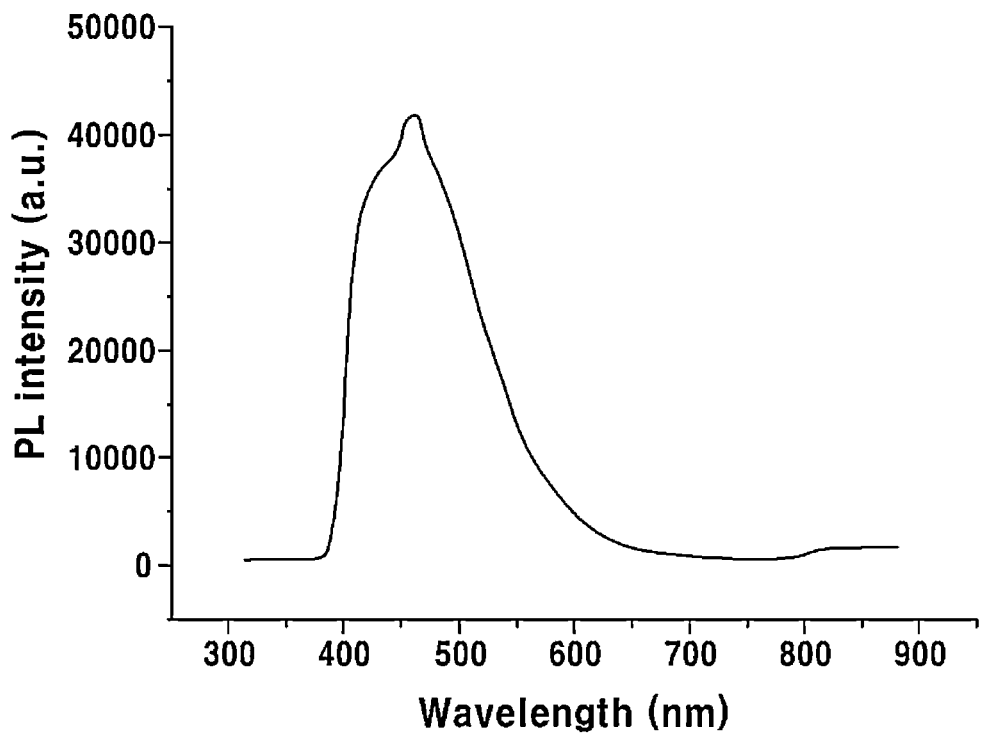
FIG. 6 is a graph showing photoluminescence measured for a graphene quantum dot produced in accordance with an example of the present application disclosure.
Figure 6:
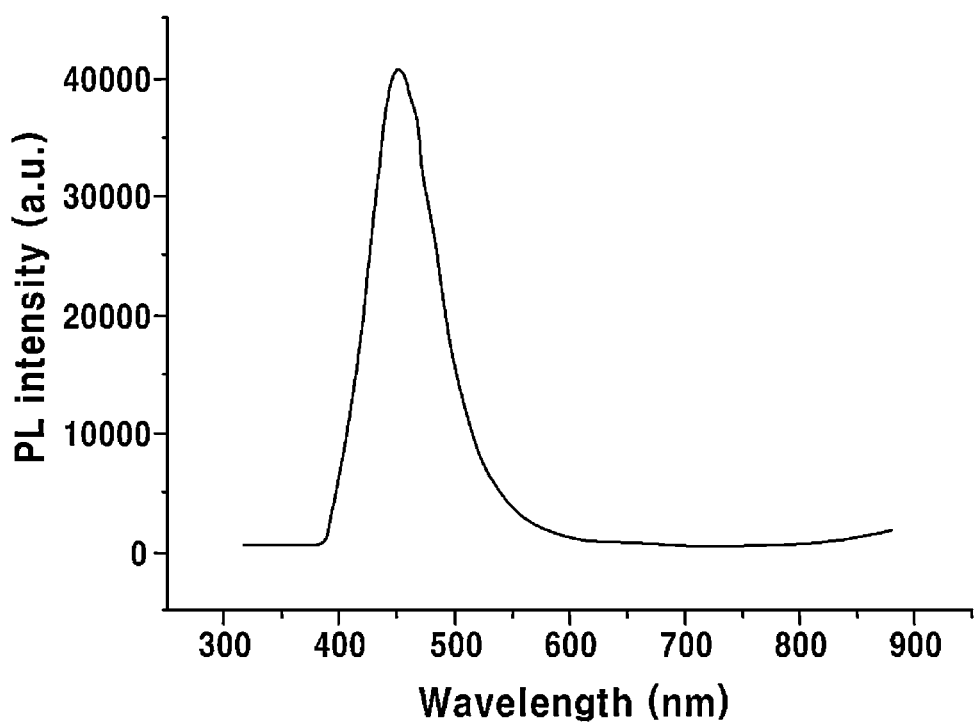

FIG. 6 shows photoluminescence graphs when the 20 cm (the upper graph) and 5 cm (the lower graph) carbon tubes were used in the present Example. According to a quantum size effect, as the size of the graphene quantum dot increases, the graphene quantum dot emits light of a longer wavelength (less energy). Accordingly, it is possible to predict a relative size of the graphene quantum dot by comparing luminescence wavelengths.

According to FIG. 6, it was confirmed that the small sized graphene quantum dot produced by using the 5 cm carbon tube exhibits photoluminescence at a shorter wavelength than that for the large sized graphene quantum dot produced by using the 20 cm carbon tube. That is, when a graphene quantum dot was produced by using the 20 cm carbon tube, compared to using the 5 cm carbon tube, a larger sized graphene quantum dot was produced.

Control of a Size of the Graphene Quantum Dot According to Controlling of a Length of the Tube (2)

In the present Example, the graphene quantum dot was produced by controlling the length of the carbon tube to be 5 cm, 10 cm and 20 cm, respectively.

Figure 7A:
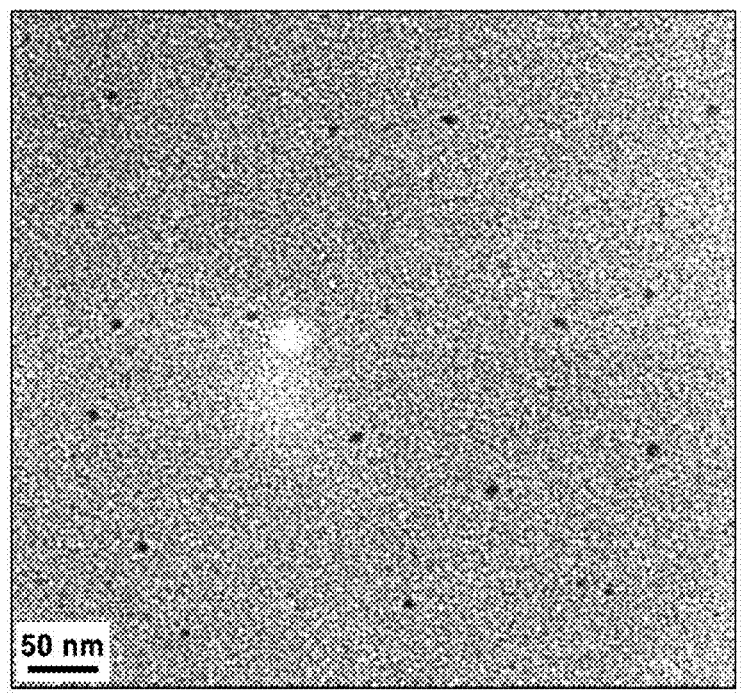
FIG. 7A and FIG. 7B are transmission electron microspore images of a graphene quantum dot produced by controlling a length of a tube in accordance with an example of the present application disclosure.
Figure 7B:
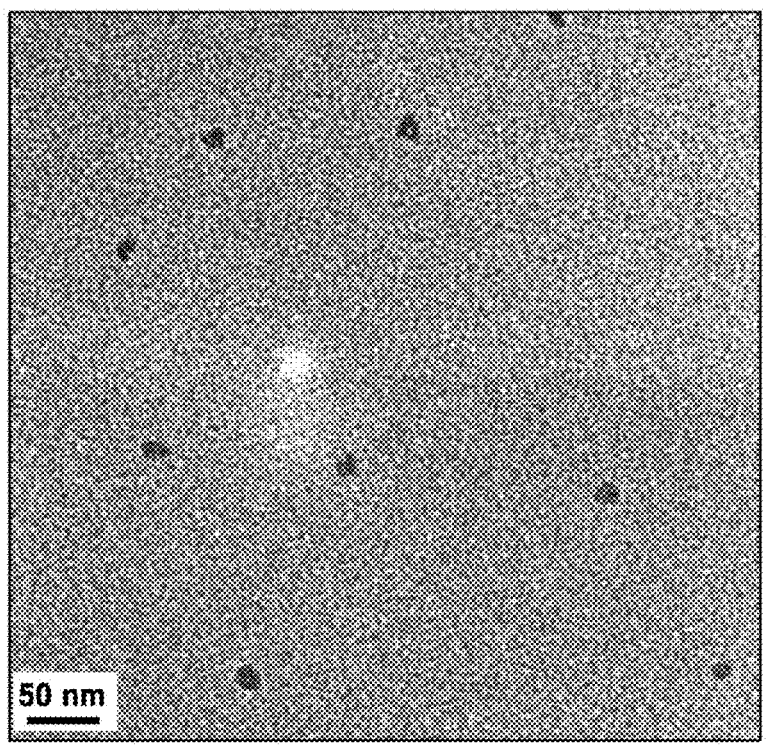

FIG. 7A and FIG. 7B are transmission electron microscope images of the graphene quantum dot produced by using the 5 cm carbon tube. In FIG. 7A, from about 8 nm to about 10 nm graphene quantum dots were observed, and in FIG. 7B, from about 15 nm or less graphene quantum dots were observed.

Figure 8A:
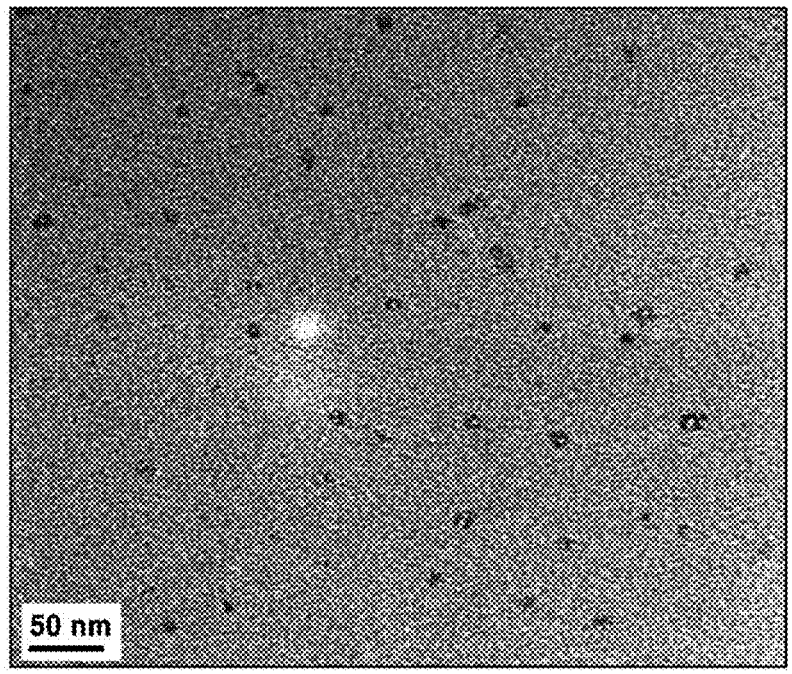
FIG. 8A to FIG. 8C are transmission electron microspore images of a graphene quantum dot produced by controlling a length of a tube in accordance with an example of the present application disclosure.
Figure 8B:
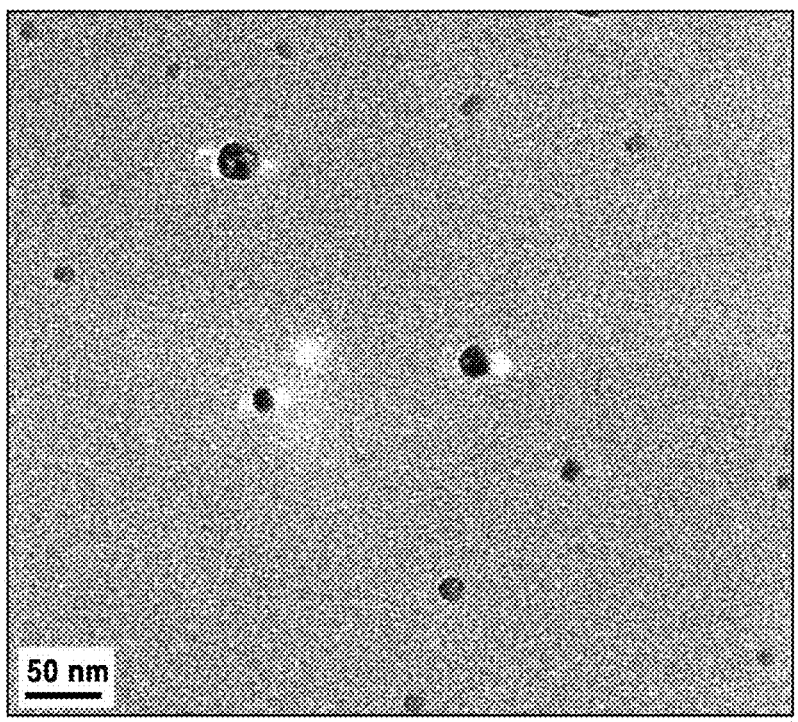
Figure 8C:
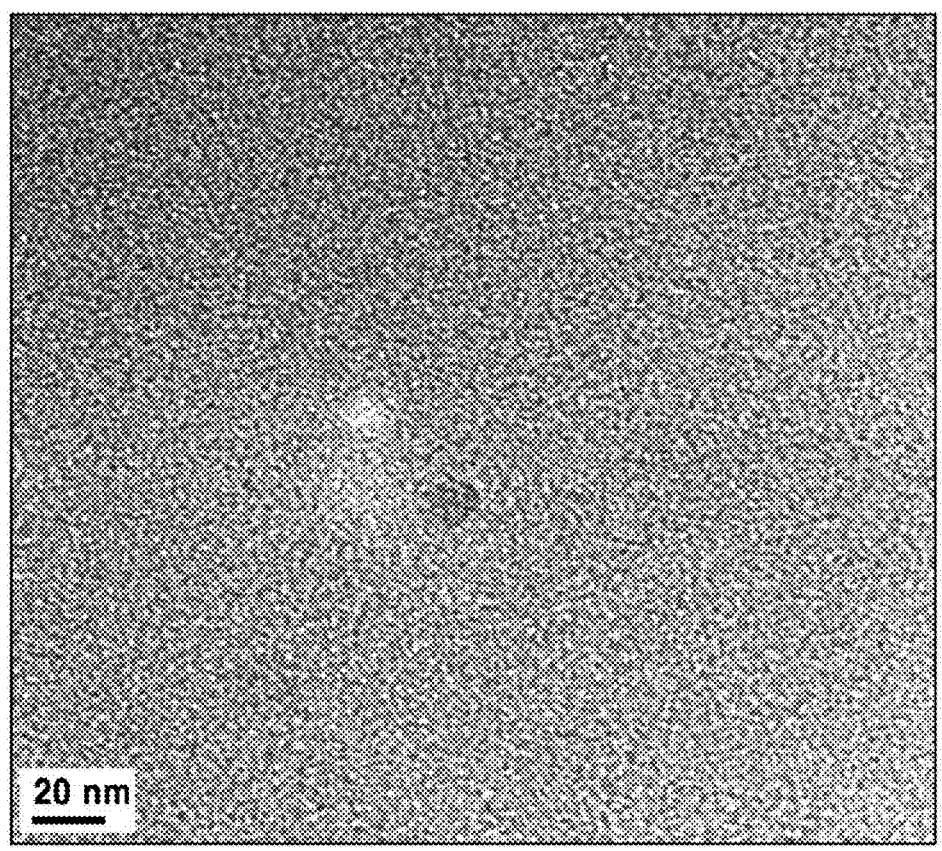

FIG. 8A to FIG. 8C are transmission electron microscope images of the graphene quantum dot produced by using the 10 cm carbon tube. In FIG. 8A, graphene quantum dots in a size of about 14 nm or less were observed; in FIG. 8B, graphene quantum dots in sizes of about 14 nm, about 17 nm, and about 25 nm, respectively, were observed; and in FIG. 8C, graphene quantum dots in a size of about 14 nm were observed.

Figure 9A:
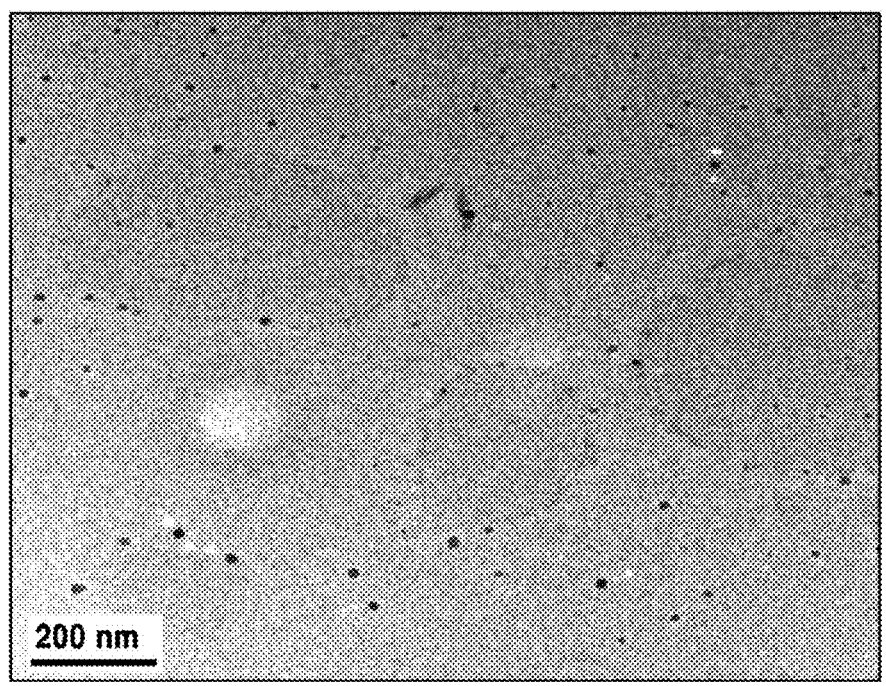
FIG. 9A to FIG. 9C are transmission electron microspore images of a graphene quantum dot produced by controlling a length of a tube in accordance with an example of the present application disclosure.
Figure 9B:
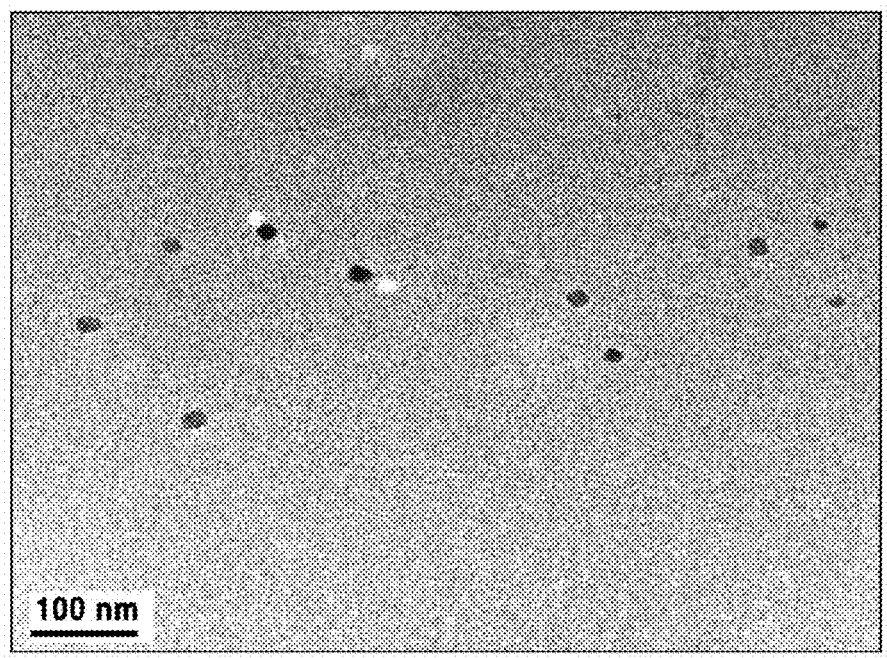
Figure 9C:
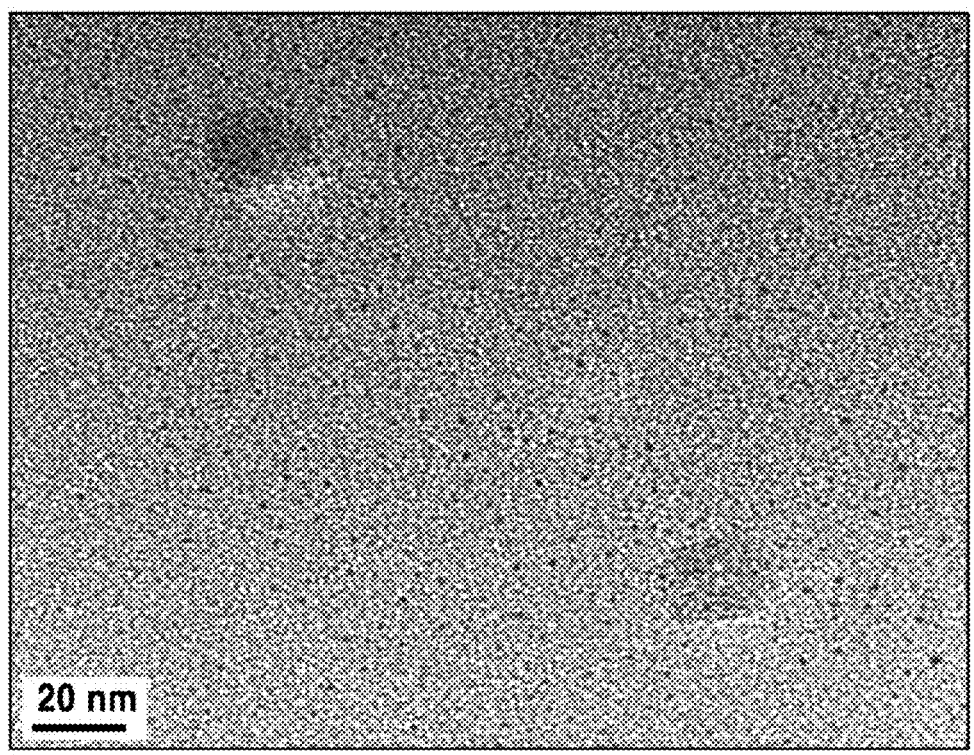

FIG. 9A to FIG. 9C are transmission electron microscope images of graphene quantum dots produced by using the 20 cm carbon tube. In FIG. 9A, graphene quantum dots in a size of from about 12 nm to about 20 nm were observed; in FIG. 9B, graphene quantum dots in a size of from about 20 nm to about 25 nm were observed; and in FIG. 9C, graphene quantum dots in a size of about 24 nm were observed.

In light of the foregoing results, it was confirmed that the size of the graphene quantum dots to be produced can be controlled with high accuracy by controlling the length of the tube.

Characterization of the Produced Graphene Quantum Dots

Figure 10:
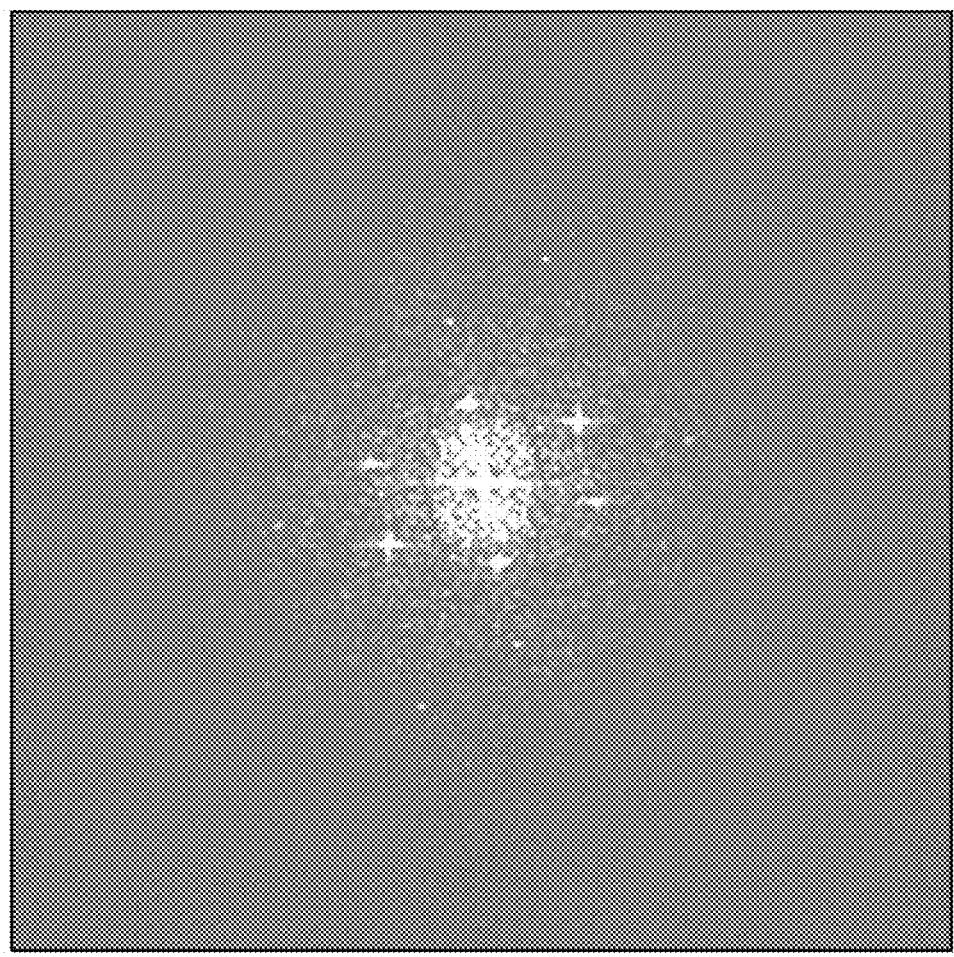
FIG. 10 is an image of 2D fast Fourier transform (FFT) analysis of a graphene quantum dot produced in accordance with an example of the present application disclosure.

Images of the graphene quantum dots produced by the above Example were obtained by using a transmission electron microscope (TEM), and simultaneously, 2D FFT thereof was measured. From the measured diffraction patterns, it can be identified whether the graphene quantum dots is a single layer or multilayer. FIG. 10 is a 2D fast Fourier transform (FFT) analysis image for the produced graphene quantum dots, and according to the diffraction patterns, it was confirmed that the graphene quantum dots were formed as a single layer.

Figure 11:
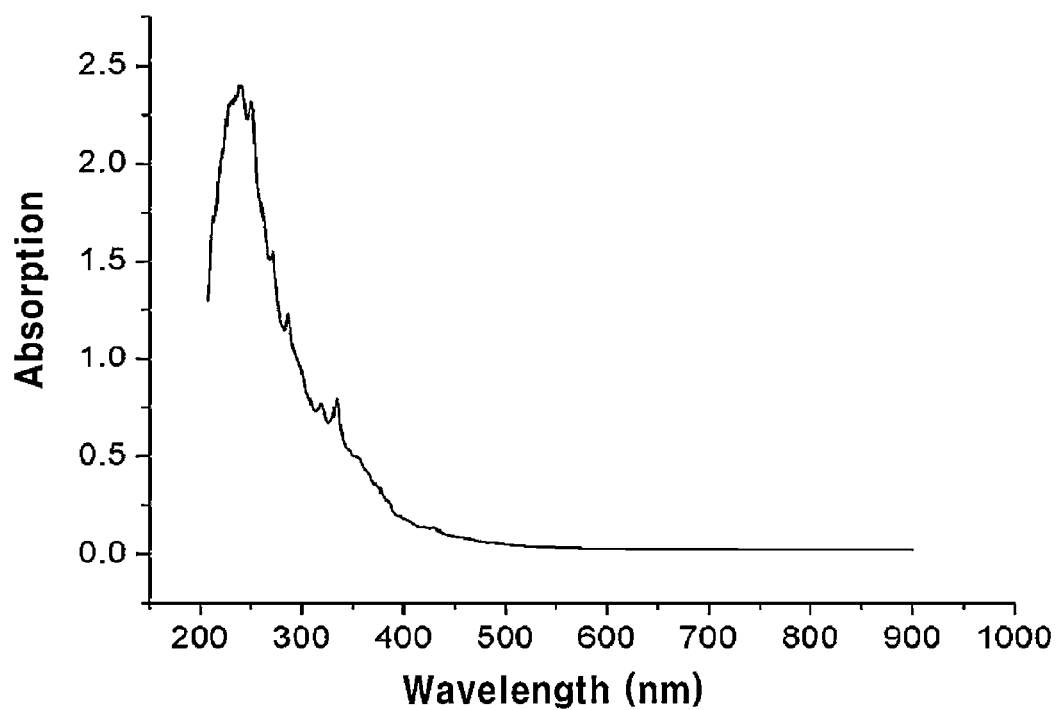
FIG. 11 is a graph showing ultraviolet-visible light absorbance measured for a graphene quantum dot produced in accordance with an example of the present application disclosure.

FIG. 11 is an absorption spectrum obtained from measuring ultraviolet-visible light absorbance of the graphene quantum dot produced by the above Example by using an ultraviolet-visible light spectroscope. According to FIG. 11, it was confirmed that the graphene quantum dot absorbs about 320 nm and about 280 nm light.

Figure 12:
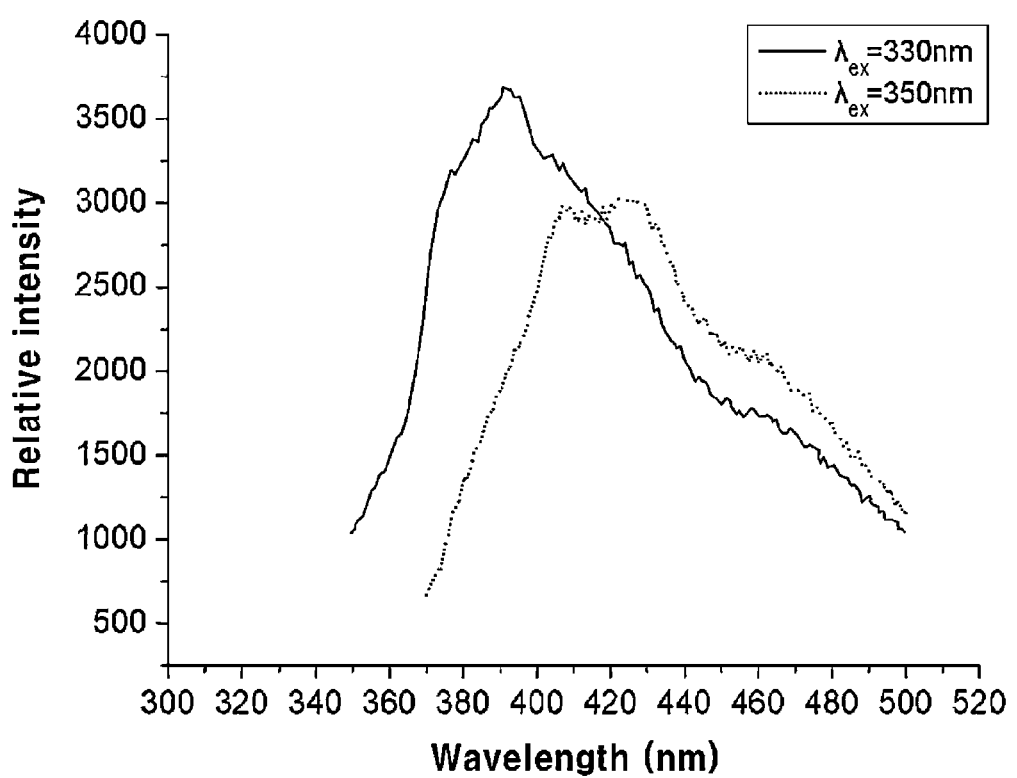
FIG. 12 is a graph showing photoluminescence measured for a graphene quantum dot produced in accordance with an example of the present application disclosure.

FIG. 12 is a graph obtained from measuring photoluminescence of the produced graphene quantum dot. According to FIG. 12, it was confirmed that the graphene quantum dot emits light in blue.

The above description of the example embodiments is provided for the purpose of illustration, and it would be understood by those skilled in the art that various changes and modifications may be made without changing technical conception and essential features of the example embodiments. Thus, it is clear that the above-described example embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the example embodiments. It shall be understood that all modifications and embodiments conceived from the meaning and scope of the claims and their equivalents are included in the scope of the inventive concept.

110: gas inlet
130: plasma jet
150: carbon source inlet
170: anode
190: cathode
210: power supply
230: tube

We claim:

1. A method for producing a graphene quantum dot using thermal plasma, comprising;
    injecting a carbon source into a thermal plasma jet to pyrolyze the carbon source so as to form a carbon atomic beam; and
    allowing the carbon atomic beam to flow in a tube connected to an anode to produce a graphene quantum dot,
    wherein, while the carbon atomic beam flows in the tube, carbon atoms are subject to collide with each other in the tube to produce the graphene quantum dot.

2. The method of claim 1, further comprising dispersing the pyrolyzed carbon source and the produced graphene quantum dot in a solvent, and separating and obtaining the graphene quantum dot.

3. The method of claim 2, wherein the solvent comprises an organic solvent.

4. The method of claim 1, wherein the thermal plasma jet is generated by supplying a plasma gas to a plasma torch.

5. The method of claim 4, wherein the plasma torch is a non-transferred type.

6. The method of claim 4, wherein the plasma gas includes a member selected from the group consisting of argon, nitrogen, hydrogen, and their combinations.

7. The method of claim 1, wherein a temperature of the thermal plasma jet is in the range of from 1,000° C. to 20,000° C.

8. The method of claim 1, wherein the carbon source is in a gaseous or liquid phase.

9. The method of claim 1, wherein the carbon source includes a member selected from the group consisting of carbon monoxide, carbon dioxide, methane, ethane, ethylene, ethanol, propanol, butanol, pentanol, acetylene, propane, butane, butadiene, pentane, pentene, cyclopentadiene, hexane, cyclohexane, benzene, toluene, and their combinations.

10. The method of claim 1, wherein the tube comprises a ceramic, metal, or carbon.

11. The method of claim 1, wherein a size of the graphene quantum dot is controlled by controlling a length of the tube.

12. The method of claim 1, wherein a size of the graphene quantum dot is controlled by controlling an amount of the injected carbon source.

* * * * *